United States Patent
Dube et al.

(10) Patent No.: US 10,353,453 B2
(45) Date of Patent: Jul. 16, 2019

(54) METHODS AND SYSTEMS FOR MULTIPLE MODULE POWER REGULATION IN A MODULAR CHASSIS

(71) Applicant: Dell Products L.P., Round Rock, TX (US)

(72) Inventors: Shawn Joel Dube, Austin, TX (US); Dan Rao, Austin, TX (US); Joyce Gil Metevier, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 232 days.

(21) Appl. No.: 14/189,360

(22) Filed: Feb. 25, 2014

(65) Prior Publication Data
US 2015/0241945 A1    Aug. 27, 2015

(51) Int. Cl.
| | |
|---|---|
| *G06F 1/3234* | (2019.01) |
| *H05K 7/14* | (2006.01) |
| *G06F 1/3206* | (2019.01) |
| *G06F 1/3203* | (2019.01) |
| *G06F 1/3287* | (2019.01) |

(52) U.S. Cl.
CPC .......... *G06F 1/3234* (2013.01); *G06F 1/3203* (2013.01); *G06F 1/3206* (2013.01); *G06F 1/3287* (2013.01); *H05K 7/1487* (2013.01); *H05K 7/1492* (2013.01)

(58) Field of Classification Search
CPC .... G06F 1/3203; G06F 1/3287; G06F 1/3234; G06F 1/3206; Y02B 60/1217
See application file for complete search history.

(56) References Cited

U.S. PATENT DOCUMENTS

| | | | | |
|---|---|---|---|---|
| 7,353,410 | B2 * | 4/2008 | Desai | G06F 1/28 702/60 |
| 8,782,450 | B2 * | 7/2014 | Cepulis | G06F 1/324 713/320 |
| 2006/0082222 | A1 * | 4/2006 | Pincu | H02J 1/102 307/29 |
| 2006/0143486 | A1 * | 6/2006 | Lamdan | G06F 1/3203 713/320 |
| 2006/0161794 | A1 * | 7/2006 | Chiasson | G06F 1/28 713/300 |
| 2007/0050647 | A1 * | 3/2007 | Conroy | G06F 1/3203 713/300 |

(Continued)

*Primary Examiner* — Jaweed A Abbaszadeh
*Assistant Examiner* — Gayathri Sampath
(74) *Attorney, Agent, or Firm* — Jackson Walker L.L.P.

(57) ABSTRACT

A controller may be communicatively coupled to a power supply and may be configured to receive a status signal indicative of whether a level of power delivered by the power supply exceeds a threshold power level. The controller may also be configured to, in response to the status signal indicating the level of power delivered by the power supply exceeds the threshold power level, cause a module power limit of at least one of a plurality of modules disposed in a chassis to decrease, wherein the module power limit of a module defines a maximum amount of power the module may consume from the power supply. The controller may also be configured to, in response to the status signal indicating the level of power delivered by the power supply does not exceed the threshold power level, cause the module power limit to increase.

14 Claims, 6 Drawing Sheets

(56) References Cited

U.S. PATENT DOCUMENTS

| | | | | |
|---|---|---|---|---|
| 2007/0245161 | A1* | 10/2007 | Shaw | G06F 1/3203 |
| | | | | 713/300 |
| 2008/0222435 | A1* | 9/2008 | Bolan | G06F 1/3203 |
| | | | | 713/310 |
| 2009/0125737 | A1* | 5/2009 | Brey | G06F 1/3203 |
| | | | | 713/322 |
| 2009/0265564 | A1* | 10/2009 | Clemo | G06F 1/3203 |
| | | | | 713/300 |
| 2009/0276776 | A1* | 11/2009 | Dube | G06F 1/206 |
| | | | | 718/100 |
| 2011/0068946 | A1* | 3/2011 | Sato | G05B 13/024 |
| | | | | 340/870.01 |
| 2012/0072745 | A1* | 3/2012 | Ahluwalia | G06F 1/26 |
| | | | | 713/320 |
| 2012/0192007 | A1* | 7/2012 | Weilnau, Jr. | G06F 1/30 |
| | | | | 714/14 |
| 2013/0073882 | A1* | 3/2013 | Inbaraj | G06F 1/3206 |
| | | | | 713/320 |
| 2013/0226362 | A1* | 8/2013 | Jagadishprasad | G06F 9/5094 |
| | | | | 700/297 |
| 2014/0149761 | A1* | 5/2014 | Allen-Ware | G06F 1/3234 |
| | | | | 713/320 |

* cited by examiner

METHODS AND SYSTEMS FOR MULTIPLE MODULE POWER REGULATION IN A MODULAR CHASSIS

TECHNICAL FIELD

The present disclosure relates to modular information handling systems. More specifically, embodiments of the disclosure provide systems and methods for deploying network switch configuration information for a modular chassis drawer for carrying one or more information handling systems configured to be disposed in a chassis configured to receive the modular chassis drawer.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Existing server architectures either provide a single monolithic server capable of running one operating system (or a single hypervisor running multiple virtualized operating systems) and input/output ("I/O") resources at a time, or bulky blade server chassis providing multiple servers and I/O control modules in a single chassis. A system chassis with multiple information handling systems with various peripheral and I/O capabilities common to the chassis as a whole may provide advantages, as it allows a blade server chassis in a small form factor, thereby providing a blade server chassis with a size comparable to the size of a monolithic server. Implementation of a system chassis with multiple information handling systems with various peripheral and I/O capabilities common to the chassis as a whole presents numerous challenges.

SUMMARY

In accordance with the teachings of the present disclosure, the disadvantages and problems associated with traditional approaches to power management and regulation in a modular chassis have been substantially reduced or eliminated.

In accordance with embodiments of the present disclosure, a chassis may include a plurality of slots, a power supply, and a controller. The plurality of slots may each be configured to receive a module having one or more information handling resources, wherein each slot is configured to electrically and communicatively couple the module to other components of the chassis. The power supply may be configured to deliver electrical energy to one or more modules received by the chassis. The controller may be communicatively coupled to the power supply and configured to: receive a status signal indicative of whether the level of power delivered by the power supply exceeds a threshold power level; in response to the status signal indicating the level of power delivered by the power supply exceeds the threshold power level, cause a module power limit of at least one of the modules to decrease, wherein the module power limit of a module defines a maximum amount of power the module may consume from the power supply; and in response to the status signal indicating the level of power delivered by the power supply does not exceed the threshold power level, cause the module power limit to increase.

In accordance with these and other embodiments of the present disclosure, a method may include, in a chassis having a plurality of slots each configured to receive a module having one or more information handling resources, wherein each slot is configured to electrically and communicatively couple the module to other components of the chassis, and a power supply configured to deliver electrical energy to one or more modules received by the chassis, receiving a status signal indicative of whether the level of power delivered by the power supply exceeds a threshold power level. The method may also include in response to the status signal indicating the level of power delivered by the power supply exceeds the threshold power level, causing a module power limit of at least one of the modules to decrease, wherein the module power limit of a module defines a maximum amount of power the module may consume from the power supply. The method may also include, in response to the status signal indicating the level of power delivered by the power supply does not exceed the threshold power level, causing the module power limit to increase.

In these and other embodiments, an article of manufacture may include a non-transitory computer readable medium and computer-executable instructions carried on the computer readable medium. The instructions may be readable by a processor, and may, when read and executed, cause the processor to, in a chassis having a plurality of slots each configured to receive a module having one or more information handling resources, wherein each slot is configured to electrically and communicatively couple the module to other components of the chassis, and a power supply configured to deliver electrical energy to one or more modules received by the chassis: receive a status signal indicative of whether the level of power delivered by the power supply exceeds a threshold power level; in response to the status signal indicating the level of power delivered by the power supply exceeds the threshold power level, cause a module power limit of at least one of the modules to decrease, wherein the module power limit of a module defines a maximum amount of power the module may consume from the power supply; and in response to the status signal indicating the level of power delivered by the power supply does not exceed the threshold power level, cause the module power limit to increase.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-7, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more busses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

In this disclosure, the term "information handling resource" may broadly refer to any component system, device or apparatus of an information handling system, including without limitation processors, busses, memories, input-output devices and/or interfaces, storage resources, network interfaces, motherboards, electro-mechanical devices (e.g., fans), displays, and power supplies.

Figure 1:
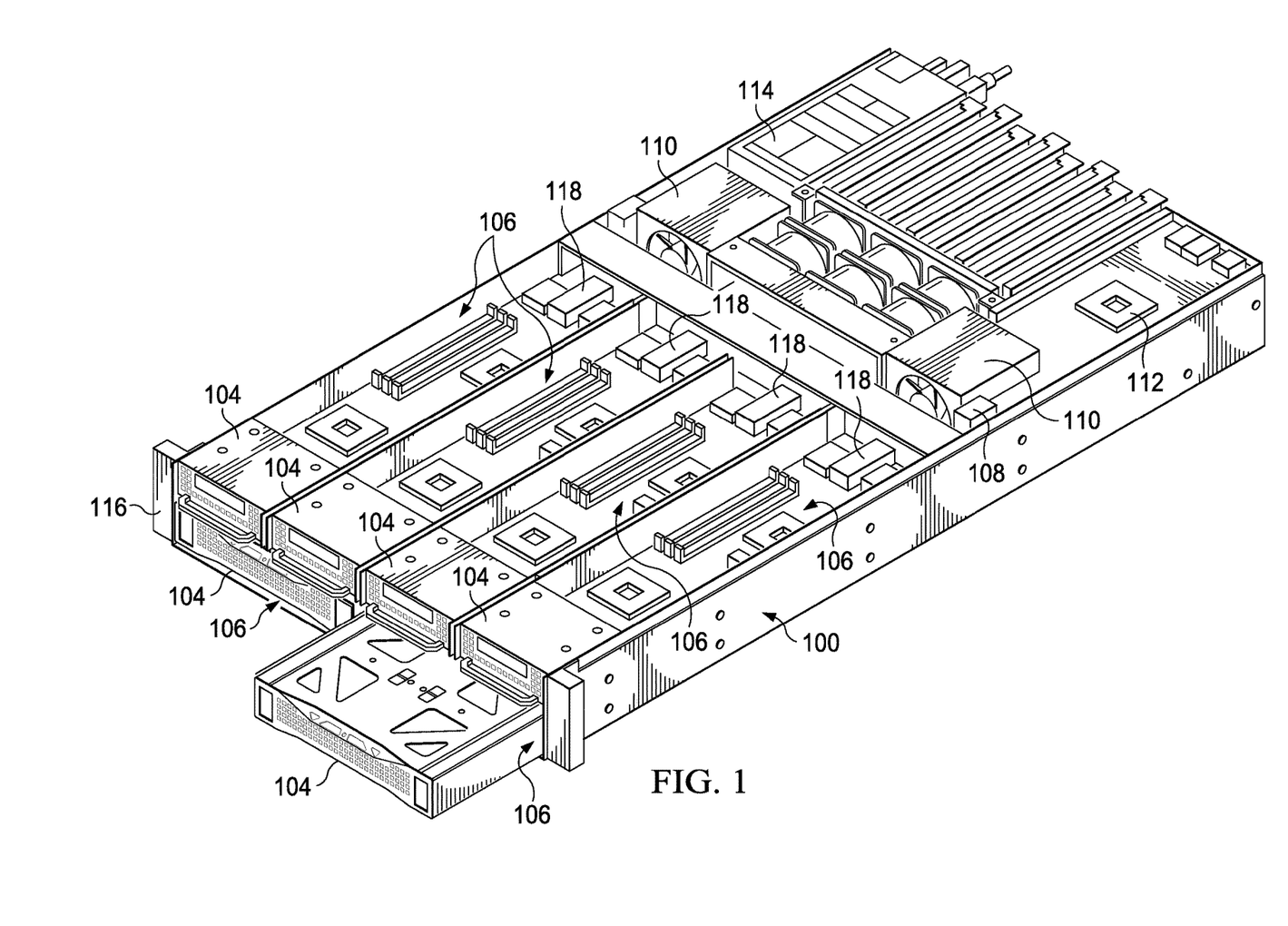
FIG. 1 illustrates a cut-away perspective view of a chassis for receiving modular information handling resources, in accordance with embodiments of the present disclosure.

FIG. 1 illustrates a perspective view of a chassis 100 for receiving modular information handling resources, in accordance with embodiments of the present disclosure, with certain elements (e.g., walls for enclosing components within chassis 100) cut-away or removed in order to show information handling resources internal to chassis 100. Chassis 100 may be an enclosure that serves as a container for various information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems and/or information handling resources. As depicted in FIG. 1, chassis 100 may include one or more slots 106 configured to receive drawers 104 for carrying information handling resources, as described in greater detail below. For example, some drawers 104 may include one or more information handling systems. As another example, some drawers 104 may include one or more peripherals (e.g., hard disk drives, graphics processing units, etc.) associated with information handling systems disposed in another drawer 104.

Each drawer 104 may include an interface connector 118 configured to electrically couple to a midplane 108, thus providing electrical coupling between information handling resources carried on the various drawers 104 to each other and/or one or more networks or devices external to chassis 100. Midplane 108 may comprise any system, device, or apparatus configured to interconnect information handling resources of chassis 100 with each other. Accordingly, midplane 108 may include slots, pads, and/or other connectors configured to receive corresponding electrical connectors of information handling resources in order to electrically couple information handling systems disposed in drawers 104 and/or information handling resources to each other.

A chassis management controller (CMC) 112 may be communicatively coupled to midplane 108 and may comprise any system, device, or apparatus configured to facilitate management and/or control of components of chassis 100, information handling systems modularly coupled within, and/or one or more of its component information handling resources. CMC 112 may be configured to issue commands and/or other signals to manage and/or control information handling systems coupled to slots 106 and/or information handling resources of chassis 100. CMC 112 may comprise a microprocessor, microcontroller, DSP, ASIC, field programmable gate array ("FPGA"), EEPROM, or any combination thereof.

In addition or alternatively, CMC 112 may also provide a management console for user/administrator access to these functions. For example, CMC 112 may provide for communication with a user interface (e.g., user interface 116), permitting a user to interact with CMC 112 and configure control and management of components of chassis 100 by CMC 112. As another example, CMC 112 may implement Web Services Management ("WS-MAN") or another suitable management protocol permitting a user to remotely access a CMC 112 to configure chassis 100 and its various information handling resources. In such embodiments, a CMC 112 may interface with a network interface separate from a traditional network interface of chassis 100, thus allowing for "out-of-band" control of chassis 100, such that communications to and from CMC 112 are communicated via a management channel physically isolated from an "in band" communication channel with the traditional network interface. Thus, for example, if a failure occurs in chassis 100 that prevents an administrator from interfacing with chassis 100 via a traditional network interface and/or user interface 116 (e.g., operating system failure, power failure, etc.), the administrator may still be able to monitor and/or manage chassis 100 (e.g., to diagnose problems that may have caused failure) via CMC 112. In the same or alternative embodiments, CMC 112 may allow an administrator to remotely manage one or more parameters associated with operation of chassis 100 and its various information handling resources (e.g., power usage, processor allocation, memory allocation, security privileges, etc.).

One or more air movers 110 may be communicatively coupled to CMC 112, and may include any mechanical or electro-mechanical system, apparatus, or device operable to move air and/or other gasses. In some embodiments, an air mover 110 may comprise a fan (e.g., a rotating arrangement of vanes or blades which act on the air). In other embodiments, an air mover 110 may comprise a blower (e.g., a centrifugal fan that employs rotating impellers to accelerate air received at its intake and change the direction of the airflow). In these and other embodiments, rotating and other moving components of an air mover 110 may be driven by a motor. The rotational speed of such motor may be controlled by one or more control signals communicated from CMC 112. In operation, an air mover 110 may cool information handling systems and information handling resources of chassis 100 by drawing cool air into chassis 100 from outside chassis 100, expel warm air from inside chassis 100 to the outside of chassis 100, and/or move air across one or more heatsinks (not explicitly shown) internal to chassis 100 to cool one or more information handling systems and/or information handling resources. Although FIG. 1 depicts chassis 100 as having two air movers 110, chassis 100 may include any suitable number of air movers 110.

As shown in FIG. 1, chassis 100 may include one or more power supplies 114. Generally speaking, a power supply 114 may include any system, device, or apparatus configured to supply electrical current to one or more information handling resources within chassis 100.

A user interface 116 may include any system, apparatus, or device via which a user may interact with chassis 100 and its various components by facilitating input from a user allowing the user to manipulate chassis 100 and output to a user allowing chassis 100 to indicate effects of the user's manipulation. For example, user interface 116 may include a display suitable for creating graphic images and/or alphanumeric characters recognizable to a user, and may include, for example, a liquid crystal display, a cathode ray tube, a plasma screen, and/or a digital light processor projection monitor. In certain embodiments, such a display may be an integral part of chassis 100 and receive power from one or more power supplies 114 of chassis 100, rather than being coupled to chassis 100 via a cable. In some embodiments, such display may comprise a touch screen device capable of receiving user input, wherein a touch sensor may be mechanically coupled or overlaid upon the display and may comprise any system, apparatus, or device suitable for detecting the presence and/or location of a tactile touch, including, for example, a resistive sensor, capacitive sensor, surface acoustic wave sensor, projected capacitance sensor, infrared sensor, strain gauge sensor, optical imaging sensor, dispersive signal technology sensor, and/or acoustic pulse recognition sensor. In these and other embodiments, user interface 116 may include other user interface elements (e.g., a keypad, buttons, and/or switches placed in proximity to a display) allowing a user to provide input to chassis 100. In these and other embodiments, user interface 116 may include one or more visual indicators, such as light-emitting diodes, for example, for communicating information to a user. User interface 116 may be coupled to CMC 112 and/or other components of chassis 100, and thus may allow a user to configure various information handling systems and/or information handling resources of chassis 100.

Figure 2:
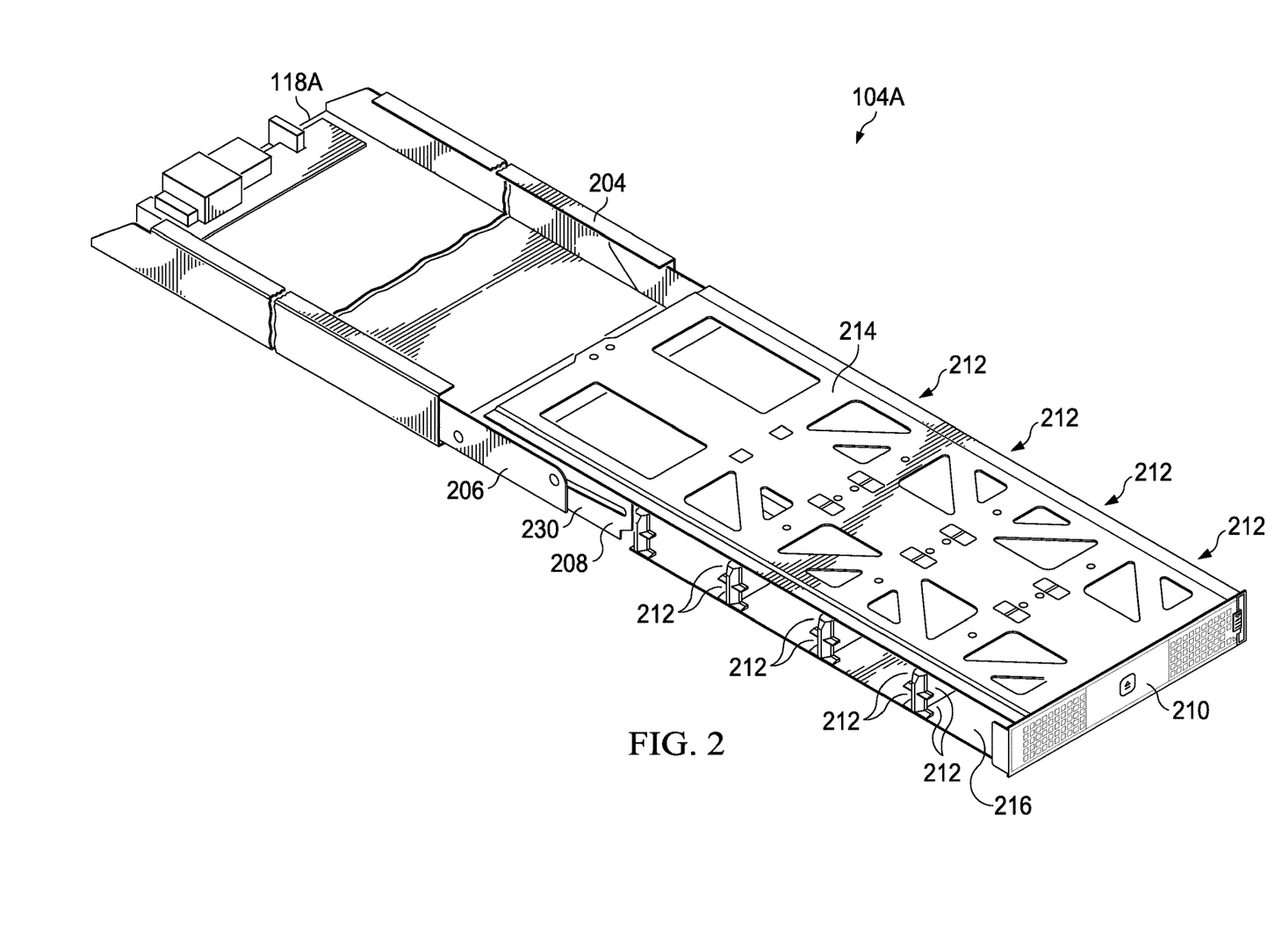
FIG. 2 illustrates a perspective view of an example chassis drawer for carrying modular information handling resources, the drawer in an open position, in accordance with embodiments of the present disclosure.
Figure 3:
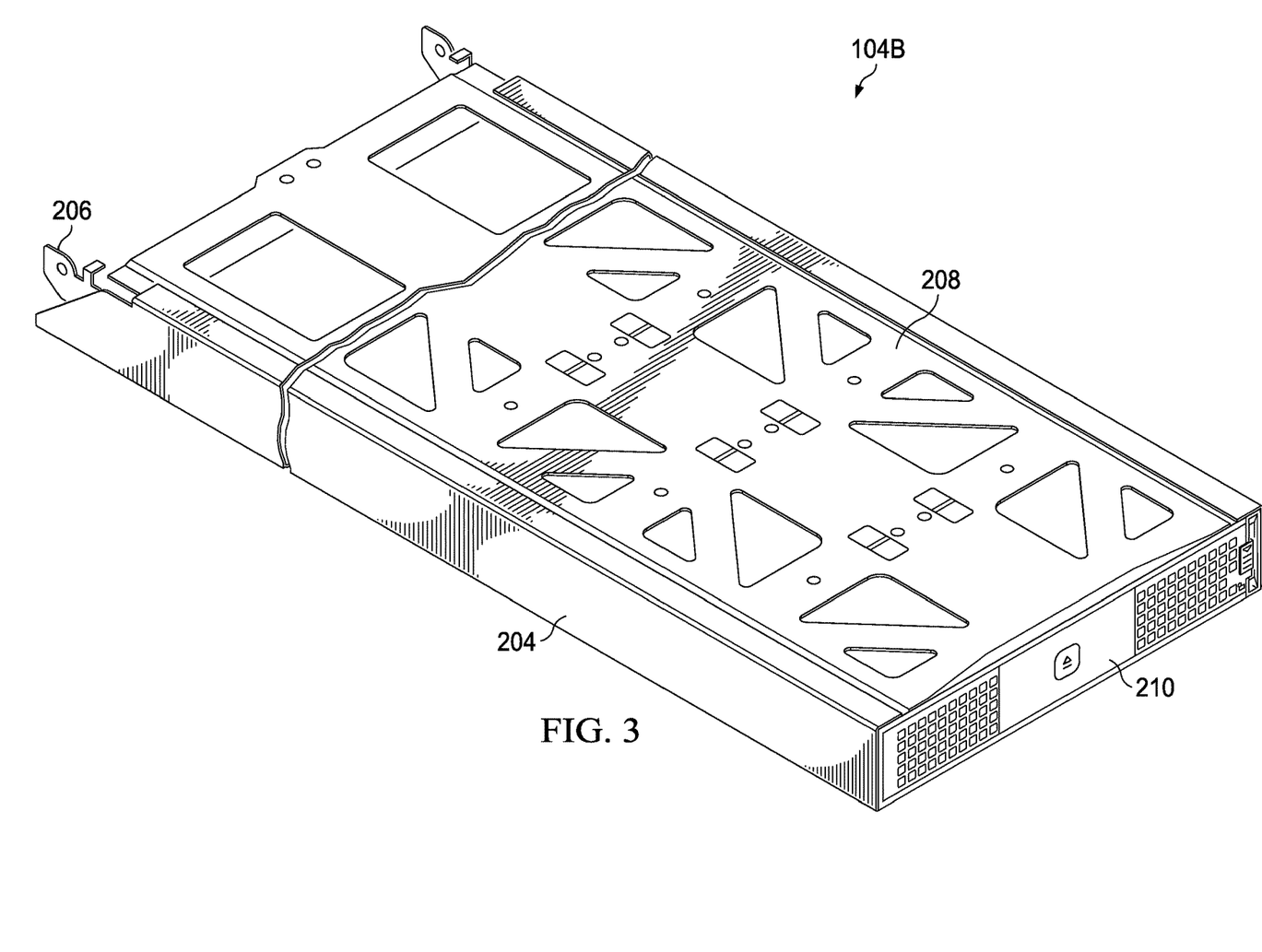
FIG. 3 illustrates a perspective view of an example chassis drawer for carrying modular information handling resources, the drawer in a closed position, in accordance with embodiments of the present disclosure.

FIGS. 2 and 3 depict various views of an example chassis drawer 104A for carrying modular information handling resources, in accordance with embodiments of the present disclosure. FIG. 2 illustrates a perspective view of an example chassis drawer 104A for carrying modular information handling resources, wherein drawer 104A is in an open position drawn from chassis 100, in accordance with embodiments of the present disclosure. FIG. 3 illustrates a perspective view of chassis drawer 104A for carrying modular information handling resources, wherein drawer 104A is in a closed position relative to chassis 100, in accordance with embodiments of the present disclosure.

As shown in FIGS. 2 and 3, chassis drawer 104A may comprise an inner member 204, an intermediate member 206 mechanically coupled to inner member 204, and a carrier member 208 mechanically coupled to intermediate member 206. Inner member 204 may be constructed from steel, aluminum, plastic, and/or any other suitable material. Although inner member 204 may have any suitable size and/or shape, inner member 204 is depicted in the embodiments of FIGS. 2 and 3 as having two substantially planar and parallel opposite sides defining a drawer height coupled to each other by a substantially planar bottom generally perpendicular to the sides defining a drawer width and a guide flange extending from and running perpendicular to and along the length of each side such that the flanges project towards each other. In some embodiments, inner member 204 may be mechanically coupled to the internal mechanical structure of chassis 100, such that inner member 204 is fixed relative to chassis 100.

Intermediate member 206 may be constructed from steel, aluminum, plastic, and/or any other suitable material. Although intermediate member 206 may have any suitable size and/or shape, intermediate member 206 is depicted in the embodiments of FIGS. 2 and 3 as having two generally parallel and planar opposite sides coupled to each other by a substantially planar bottom generally perpendicular to the sides. The height of the sides and the width of the bottom may be such that the corresponding sides and bottom of inner member 204 provide a mechanical guide for intermediate member 206 as chassis drawer 104A is opened and closed. Intermediate member 206 may be mechanically coupled to inner member 204 via bearings and/or other mechanical components such that intermediate member 206 may slide relative to inner member 204 in a direction perpendicular to the drawer height and drawer width defined by inner member 204. In some embodiments, intermediate member 206 may be limited in the distance it may be drawn from chassis 100 through any combination of suitable structural elements. Similarly, in some embodiments, other mechanical components may restrict motion of intermediate member 206 relative to inner member 204 as chassis drawer 104A is translated from the open position to the closed position.

Carrier member 208 may be constructed from steel, aluminum, plastic, and/or any other suitable material. Although carrier member 208 may have any suitable size and/or shape, carrier member 208 is depicted in the embodiments of FIGS. 2 and 3 as having a substantially planar top 214 and a substantially planar bottom 216 generally parallel to each other defining a width and depth of carrier member 208, the top 214 and bottom 216 mechanically coupled to each other by one or more structural elements defining a height of carrier member 208, such that top 214 and bottom 216 are generally perpendicular to the sides of intermediate member 206. Carrier member 208 may also include a face 210 mechanically affixed to top 214 and/or bottom 216. As shown in FIGS. 2 and 3, top 214 may include one or more openings (e.g., above bays 212) allowing for gaseous fluid to pass through. Similarly, bottom 216 may also include one or more openings (e.g., below bays 212) allowing for gaseous fluid to pass through.

In some embodiments, face 210 may be substantially equal in width to the width of carrier member 208 and substantially equal to the height of carrier member 208. In these and other embodiments, face 210 may include handles, pull tabs, and/or other features allowing a person to pull on face 210 in order to translate chassis drawer 104A from a closed position to an open position in a direction generally parallel to the depth of top 214 and bottom 216. In these and other embodiments, face 210 may include a grill, vent, and/or other opening allowing gaseous fluid to enter and/or exit through face 210.

As shown in FIG. 2, each side of carrier member 208 (e.g., portions of carrier member 208 between the edges of and substantially parallel to top 214 and bottom 216) may include a web 230 configured to mechanically couple carrier member 208 to intermediate member 206, as well as openings for a plurality of bays 212.

Each of the various bays 212 defined by drawer 104A may include one or more electrical components for coupling an information handling resource (e.g., a hard disk drive) inserted into such bay 212 to other information handling resources of chassis 100. For example, a backplane (not explicitly shown) may couple a modular information handling resource disposed in a bay 212 to interface connector 118A, which, as described above, may in turn be coupled to midplane 108. In some embodiments, the various information handling resources may be coupled to interface connector 118A such that when chassis drawer 104A is drawn open relative to chassis 100, such information handling resources maintain electrical conductivity to interface connector 118A and interface connector 118A may maintain electrical conductivity to midplane 108, thus permitting insertion or removal of an information handling resource without affecting operation of other information handling resources carried by chassis drawer 104A. In such embodiments, interface connector 118A may only be decoupled from midplane 108 when the entirety of chassis drawer 104A is removed from chassis 100.

Figure 4:
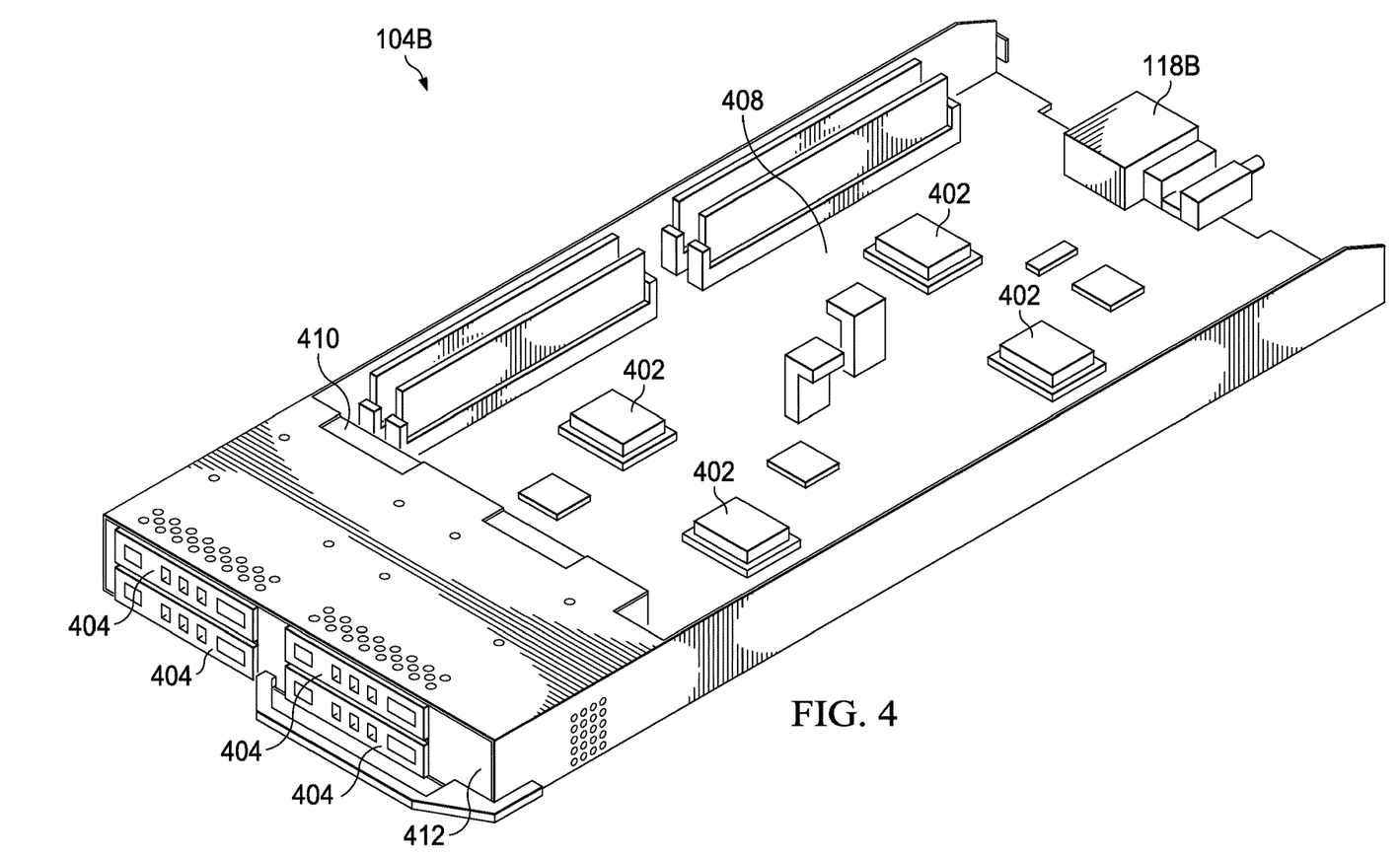
FIG. 4 illustrates a perspective view of another example chassis drawer for carrying information handling resources, in accordance with embodiments of the present disclosure.

FIG. 4 illustrates a perspective view of another example chassis drawer 104B for carrying information handling resources, in accordance with embodiments of the present disclosure. Although not labeled in detail as in FIGS. 2 and 3, chassis drawer 104B may include one or more mechanical and/or structural elements (e.g., similar or identical to inner member 204, intermediate member 206, and carrier member 208) for translating chassis drawer 104B between open and closed positions relative to chassis 100. Similar to chassis drawer 104A, the various information handling resources carried by chassis drawer 104B may be coupled to interface connector 118B such that when chassis drawer 104B is drawn open relative to chassis 100, such information handling resources maintain electrical conductivity to interface connector 118B and interface connector 118B may maintain electrical conductivity to midplane 108, thus permitting insertion or removal of an information handling resource without affecting operation of other information handling resources carried by chassis drawer 104B. In such embodiments, interface connector 118B may only be decoupled from midplane 108 when the entirety of chassis drawer 104B is removed from chassis 100.

In the particular chassis drawer 104B depicted in FIG. 4, a backplane 408 may have thereon a plurality (e.g., four) of processors 402 and a chipset associated with each processor 402, thus defining four independent information handling systems carried by chassis drawer 104B. Interface connector 118B may also be coupled to backplane 408, thus coupling processors 402 to information handling resources of chassis 100 external to chassis drawer 104B. In addition, the particular chassis drawer 104B depicted in FIG. 4 may include a plurality (e.g., four) of hard disk drives 404 communicatively coupled to backplane 408 (and thus one or more of processors 402) via a drive backplane 410.

As shown in FIG. 4, chassis drawer 104B may comprise a user interface 412. User interface 412 may include any system, apparatus, or device via which a user may interact with compute nodes (e.g., via a remote access controller such as an Integrated Dell Remote Access Controller or "iDRAC" for example) of chassis drawer 104B and its various components by facilitating input from a user allowing the user to compute nodes and to indicate effects of the user's manipulation. For example, user interface 412 may include a display suitable for creating graphic images and/or alphanumeric characters recognizable to a user, and may include, for example, a liquid crystal display, a cathode ray tube, a plasma screen, and/or a digital light processor projection monitor. In some embodiments, such display may comprise a touch screen device capable of receiving user input, wherein a touch sensor may be mechanically coupled or overlaid upon the display and may comprise any system, apparatus, or device suitable for detecting the presence and/or location of a tactile touch, including, for example, a resistive sensor, capacitive sensor, surface acoustic wave sensor, projected capacitance sensor, infrared sensor, strain gauge sensor, optical imaging sensor, dispersive signal technology sensor, and/or acoustic pulse recognition sensor. In these and other embodiments, user interface 412 may include other user interface elements (e.g., a keypad, buttons, and/or switches placed in proximity to a display) allowing a user to provide input to one or more compute nodes of chassis drawer 104B. In these and other embodiments, user interface 412 may include one or more visual indicators, such as light-emitting diodes, for example, for communicating information to a user.

Although FIGS. 2-4 depict particular example chassis drawers 104, chassis drawers 104 with other configurations may be employed consistent with the systems and methods herein disclosed. For example, in some embodiments, a chassis drawer 104 similar to that of chassis drawer 104B may include only one processor, such that the chassis drawer includes one compute node.

A particular challenge of a modular chassis, such as chassis 100, is configuring parameters of information handling resources of the various chassis drawers 104 installed in chassis 100 so as to properly regulate power consumption in chassis 100 so as to not exceed the power capacity of the power supplies of the chassis. Often, such configuration must be manually performed, which is time consuming and prone to error. Such challenge is further exacerbated in an enterprise with multiple chasses each having multiple information handling systems instantiated therein.

Figure 5:
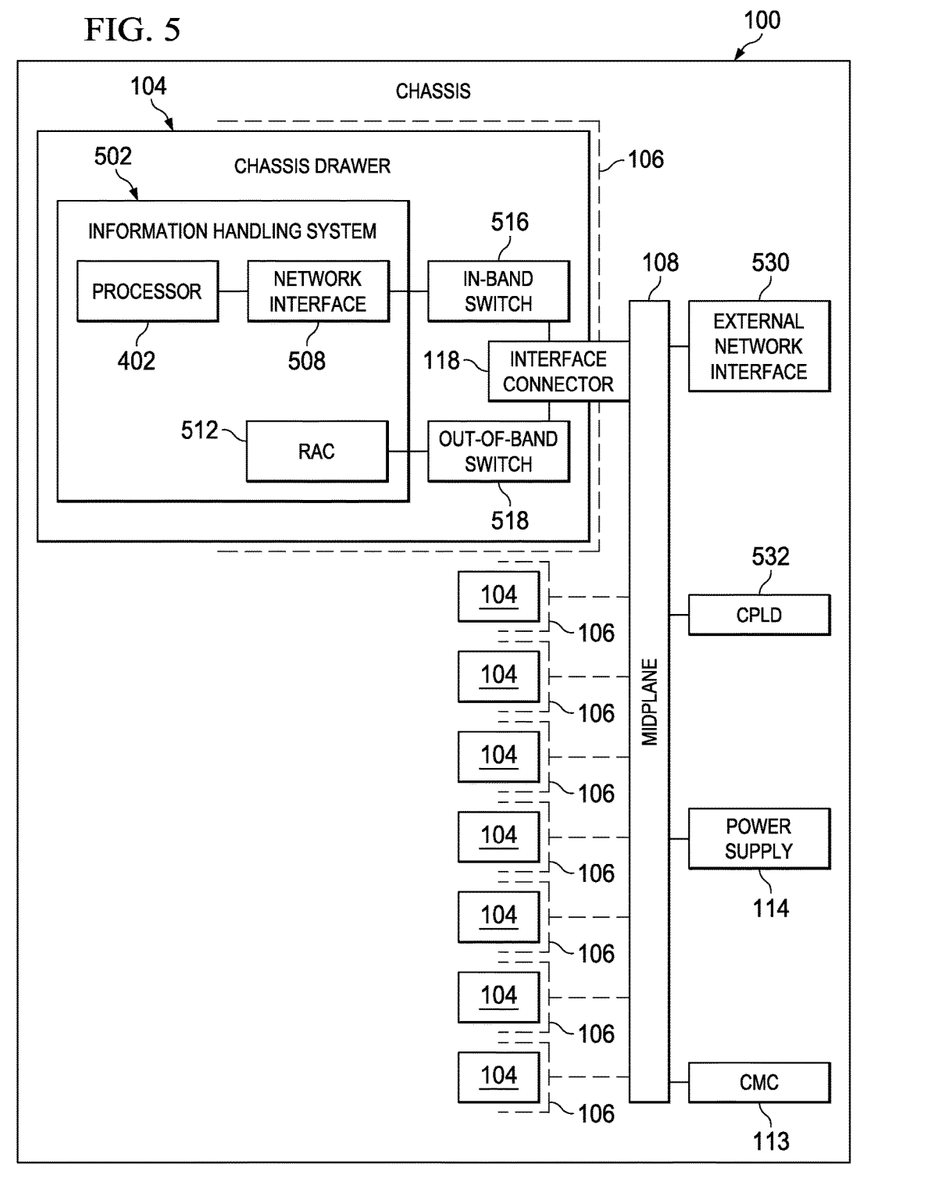
FIG. 5 illustrates an example functional block diagram of selected components of the chassis depicted in FIG. 1, in accordance with embodiments of the present disclosure.

FIG. 5 illustrates an example functional block diagram of selected components of chassis 100 depicted in FIG. 1, in accordance with embodiments of the present disclosure. As shown in FIG. 5, and as discussed above, chassis 100 may include a plurality of slots 106 communicatively coupled to a midplane 108, wherein each slot is configured to receive a modular chassis drawer 104, wherein such chassis drawers 104 may carry information handling systems, hard disk drives, and which may or may not be similar to chassis drawers 104A and 104B described above.

As shown in FIG. 5, a chassis drawer 104 may include an information handling system 502, which may comprise a server or other suitable computing node, an in-band switch 516, and an out-of-band switch 518. Among other components, an information handling system 502 may comprise a processor 402, a network interface 508 communicatively coupled to its associated processor 402, and a remote access controller (RAC) 512.

A processor 402 may include any system, device, or apparatus configured to interpret and/or execute program instructions and/or process data, and may include, without limitation, a microprocessor, microcontroller, digital signal processor ("DSP"), application specific integrated circuit ("ASIC"), or any other digital or analog circuitry configured to interpret and/or execute program instructions and/or process data. In some embodiments, processor 402 may interpret and/or execute program instructions and/or process data stored in a memory or other computer-readable media accessible to processor 402.

A network interface 508 may comprise any suitable system, apparatus, or device operable to serve as an interface between an associated information handling system 502 and a private communication network internal to a chassis drawer 104 formed by information handling system 502 and in-band switch 516. Network interface 508 may enable an associated information handling system 502 to communicate using any suitable transmission protocol and/or standard. In some embodiments, network interface 508 may comprise one or more network interface cards, or "NICs." In other embodiments, network interface 508 may comprise one or more local area network (LAN)-on-motherboard (LOM) devices. In these and other embodiments, network interface 508 may include a plurality of NICs, LOMs, or other network interface devices, in order to provide communication redundancy or robustness.

A RAC 512 may be implemented by, for example, a microprocessor, microcontroller, DSP, ASIC, EEPROM, or any combination thereof. RAC 512 may be configured to communicate with CMC 112. Such communication may be made, for example, via private management network fabric implemented using out-of-band switch 518. RAC 512 may be configured to provide out-of-band management facilities for management of an associated information handling system 502. Such management may be made by CMC 112 even if information handling system 502 is powered off or powered to a standby state. A RAC 512 may include a processor, memory, and network connection separate from the rest of its associated information handling system 502. In certain embodiments, a RAC 512 may include or may be an integral part of a baseboard management controller (BMC), Dell Remote Access Controller (DRAC) or an Integrated Dell Remote Access Controller (iDRAC).

In-band switch 516 may comprise any system, device, or apparatus configured to couple network interfaces 508 of information handling systems 502 to external network interface 530 and perform switching between network interfaces 508 and an external communication network communicatively coupled to external network interface 530 based on a network configuration of various ports (not explicitly shown) of network interfaces 508, in-band switch 516, and external network interface 530, as described in greater detail below. In-band switch 516 may comprise a PCIe switch, a generalized PC bus switch, an Infiniband switch, or other suitable switch.

Similarly, out-of-band switch 518 may comprise any system, device, or apparatus configured to couple RAC 512 of information handling system 502 to CMC 112 and perform switching between RAC 512 and CMC 112 in order to provide for centralized management of information handling systems 502 via a management console coupled to CMC 112.

As shown in FIG. 5, an external network interface 530 may be communicatively coupled to midplane 108. External network interface 530 may comprise any suitable system, apparatus, or device operable to serve as an interface between chassis 100 and a network external to chassis 100. External network interface 530 may enable information handling system 502 to communicate with such external network using any suitable transmission protocol and/or standard. In some embodiments, external network interface 530 may comprise one or more network interface cards, or "NICs." In other embodiments, external network interface 530 may comprise one or more input/output module (IOM) devices. In these and other embodiments, external network interface 530 may include a plurality of NICs, IOMs, or other network interface devices, in order to provide communication redundancy or robustness.

A complex programmable logic device (CPLD) 532 or other processing device may be coupled to midplane 108. CPLD 532 may be configured to, as described in greater detail below, control a power consumption limit for chassis drawers 104.

As shown in FIG. 5 and described above, CMC 112 and power supply 114 may also be communicatively coupled to midplane 108. For illustrative purposes, only one power supply 114 is depicted in FIG. 5. However, in some embodiments of the present disclosure, chassis 100 may include a plurality of power supplies 114.

In operation, CMC 112 (or another controller of chassis 100) may set a power supply threshold for power supply 114. In embodiments with a plurality of power supplies 114, a separate power supply threshold may be set for each individual power supply 114. Such power supply threshold may be set based on a policy in light of characteristics of power supply 114 and/or chassis (e.g., power supply redundancy, user-established power maximum, etc.). In the absence of a policy, the power supply threshold may be a preset value (e.g., determined by a manufacturer or other provider of power supply 114).

Based on its respective power supply threshold and its actual power usage, a power supply 114 may be configured to generate a power supply status signal (e.g., assert an alert signal when power usage is above the power supply threshold and deassert the alert signal when power usage is below the power supply threshold). An example method for generating the power supply status signal is shown in FIG. 6.

Figure 6:
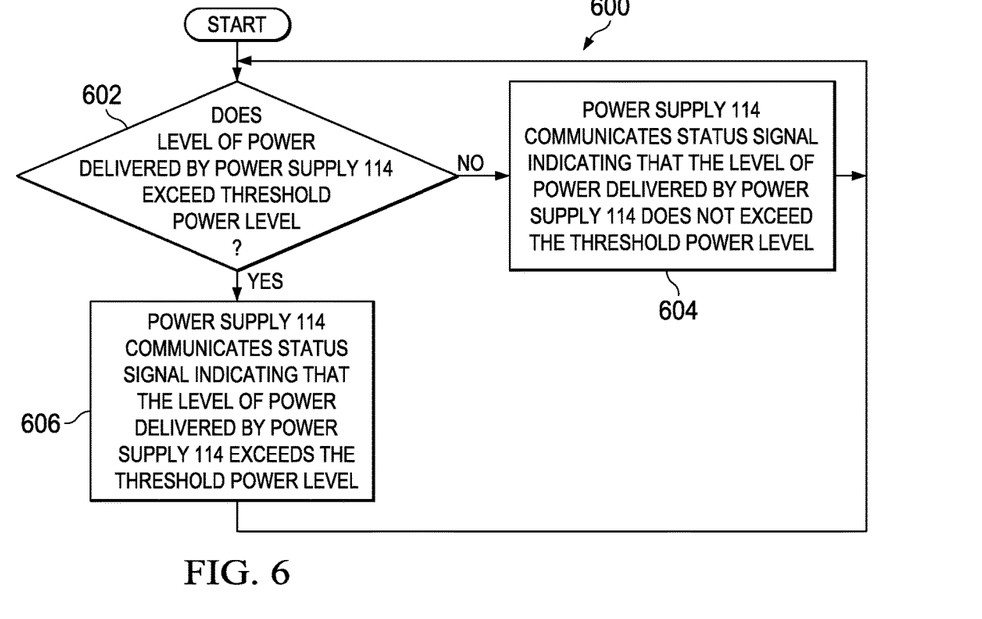
FIG. 6 illustrates a flow chart of an example method for generating a power supply status signal in a chassis configured to receive a plurality of information handling resource modules, in accordance with embodiments of the present disclosure.

FIG. 6 illustrates a flow chart of an example method 600 for generating a power supply status signal in a chassis (e.g., chassis 100) configured to receive a plurality of information handling resource modules (e.g., chassis drawers 104), in accordance with embodiments of the present disclosure. According to some embodiments, method 600 may begin at step 602. As noted above, teachings of the present disclosure may be implemented in a variety of configurations of chassis 100. As such, the preferred initialization point for method 600 and the order of the steps comprising method 600 may depend on the implementation chosen.

At step 602, power supply 114 may monitor a level of power it is delivering to chassis drawers 104 and other components of chassis 100 and compare the level to a threshold power level. If the level exceeds the threshold power level, method 600 may proceed to step 606. Otherwise, method 600 may proceed to step 604.

At step 604, in response to the level of power delivered by power supply 114 not exceeding the threshold power level, power supply 114 may communicate the status signal (e.g., deassert the alert signal) indicating that the level of power delivered by power supply 114 does not exceed the threshold power level. After completion of step 604, method 600 may proceed again to step 602.

At step 606, in response to the level of power delivered by power supply 114 exceeding the threshold power level, power supply 114 may communicate a status signal (e.g., assert an alert signal) indicating that the level of power delivered by power supply 114 exceeds the threshold power level. After completion of step 606, method 600 may proceed again to step 602.

Although FIG. 6 discloses a particular number of steps to be taken with respect to method 600, method 600 may be executed with greater or fewer steps than those depicted in FIG. 6. In addition, although FIG. 6 discloses a certain order of steps to be taken with respect to method 600, the steps comprising method 600 may be completed in any suitable order.

Method 600 or portions thereof may be implemented using a controller, processor, and/or one or more other systems operable to implement method 600. In certain embodiments, method 600 may be implemented partially or fully in software and/or firmware embodied in computer-readable media and executable on a processor of an information handling system or other controller.

CPLD 532 may be configured to continuously calculate a module power limit which ultimately limits power consumption of the various chassis drawers 104, wherein such module limit is based on the power supply status signal of power supply 114. CPLD 532 may also communicate this module power limit to the various chassis drawers 104, which may in turn adjust their power consumption to remain equal to or below the module power limit. Each chassis drawer 104 may consume any amount of power provided that it remains, averaged over a period of time, equal to or below the module power limit set by CPLD 532.

In operation, CPLD 532 may receive the power supply status signal from power supply 114. When the power supply status signal indicates that the level of power delivered by power supply 114 exceed the threshold power level, CPLD 532 may decrease the module power limit. On the other hand, when the power supply status signal indicates that the level of power delivered by power supply 114 does not exceed the threshold power level, CPLD 532 may increase the module power limit. In some embodiments, such increases or decreases in the module power limit may be at a fixed rate. In other embodiments, such increases or decreases in the module power limit may be at a variable rate. For example, CPLD 532 may be configured to provide a particular rate of decrease of the module power limit when the power supply status signal first indicates that the power usage has exceeded the threshold power level, but also provide a greater rate of decrease of the module power limit if the threshold power level has been exceeded for greater than a threshold period of time.

In these and other embodiments, CPLD 532 may receive power usage information from chassis drawers 104. Such information may be used to accelerate the rate of reduction of power consumption when the power supply status signal first indicates that the power usage has exceeded the threshold power level, such that a module power limit is reduced to a level that causes immediate reduction in power usage of chassis drawers 104. For example, in response to the power supply status signal changing from an indication that the power usage is below the threshold power level to an indication that the power usage is above the threshold power level, the module power limit may instantaneously decrease to the power usage level of the chassis drawer consuming the most power, and then decrease at a particular rate thereafter. Similarly, in these and other embodiments, CPLD 532 may determine the power output by power supply unit 114 and based thereon, calculate a module power limit resulting in the power consumed by all chassis drawers 104 to equal the threshold power level of power supply 114.

In these and other embodiments, the functionality of CPLD 532 may be distributed to the individual chassis drawers 104, such that each chassis drawer 104 received the power supply status signal from CMC 112 and determines its own respective module power limit. In such embodiments, a chassis drawer 104 may vary its rate of increase or decrease of its respective module power limit in proportion to its share of overall power usage in chassis 100.

Alternatively in such embodiments, a chassis drawer may apply a stochastic characteristic to maintain the module power limit proportional to its share of power usage. For example, when the power supply status signal indicates that the power usage has exceeded the threshold power level, a chassis drawer may apply trials at randomly-determined intervals. The result of each trial may alter the module power limit or have no effect. The probability distribution between both results may be adjusted based on the proportional share of power usage of the particular chassis drawer 104. This may produce a similar result to the "deterministic" approach of the previous paragraph, but includes a random element which, over time, may remove sampling error that may occur between two or more chassis drawers 104.

Figure 7:
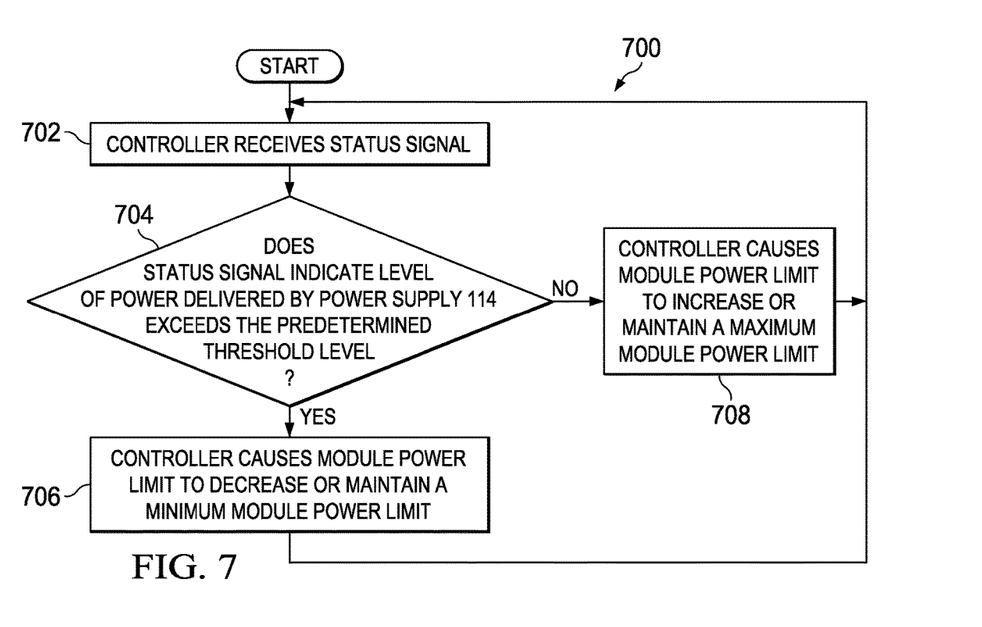
FIG. 7 illustrates a flow chart of an example method for regulating power in a chassis configured to receive a plurality of information handling resource modules, in accordance with embodiments of the present disclosure.

FIG. 7 illustrates a flow chart of an example method 700 for regulating power in a chassis (e.g., chassis 100) configured to receive a plurality of information handling resource modules (e.g., chassis drawers 104), in accordance with embodiments of the present disclosure. According to some embodiments, method 700 may begin at step 702. As noted above, teachings of the present disclosure may be implemented in a variety of configurations of chassis 100. As such, the preferred initialization point for method 700 and the order of the steps comprising method 700 may depend on the implementation chosen.

At step 702, a controller of chassis 100 (e.g., CMC 112 or another controller) may receive the power supply status signal. At step 704, the controller may determine whether the status signal indicates whether the level of power delivered by power supply 114 exceeds the predetermined threshold level. If the status signal indicates the level of power delivered by power supply 114 exceeds the predetermined threshold level, method 700 may proceed to step 706. Otherwise, method 700 may proceed to step 708.

At step 706, in response to the status signal indicating the level of power delivered by power supply 114 exceeds the predetermined threshold level, the controller may cause a module power limit to decrease, wherein the module power limit defines a maximum power that power supply 114 may deliver to one or more of chassis drawers 104 engaged with chassis 100, such that each such chassis drawer 104 is limited to drawing an amount of power approximately equal (e.g., within manufacturing, process, and/or measurement tolerances and errors) to the module power limit. In some embodiments, the controller may be configured so as to apply a minimum module power limit for the module power limit, so that the module power limit does not decrease below the minimum module power limit.

After completion of step 706, method 700 may proceed again to step 702.

At step 708, in response to the status signal indicating the level of power delivered by power supply 114 does not exceed the predetermined threshold level, the controller may cause the module power limit to increase. After completion of step 706, method 700 may proceed again to step 702. In some embodiments, the controller may be configured so as to apply a maximum module power limit for the module power limit, so that the module power limit does not increase above the maximum module power limit.

Although FIG. 7 discloses a particular number of steps to be taken with respect to method 700, method 700 may be executed with greater or fewer steps than those depicted in FIG. 7. In addition, although FIG. 7 discloses a certain order of steps to be taken with respect to method 700, the steps comprising method 700 may be completed in any suitable order.

Method 700 or portions thereof may be implemented using CMC 112, a remote access controller 512, and/or one or more other systems operable to implement method 700. In certain embodiments, method 700 may be implemented partially or fully in software and/or firmware embodied in computer-readable media and executable on a processor of an information handling system or other controller.

Although the foregoing discussion contemplates embodiments particular actions taken by a specific controller (e.g., CMC 112 or CPLD 532), in some embodiments the functionality of CMC 112 or CPLD 532 may be distributed among CMC 112, CPLD 532, and/or another controller in any suitable manner.

Chassis drawers 104 or other power consuming modules of chassis 100 may use the module power limit to adjust their individual levels of power consumption (e.g., by modifying clock frequency and/or other parameters) to avoid, over a period of time, exceeding their individual module power limits.

In some embodiments, a module power limit may be interpreted not as an absolute power value, but one proportional to the size of the chassis drawer 104. For example, a "half-size" chassis drawer 104 may treat the sled power limit value as having a unit twice that of a "quarter-size" chassis drawer 104, and a "full-size" chassis drawer 104 may treat the module power limit values as having a unit four times that of a "quarter-size" chassis drawer 104.

Although the present disclosure has been described in detail, it should be understood that various changes, substitutions, and alterations can be made hereto without departing from the spirit and the scope of the disclosure as defined by the appended claims.

What is claimed is:

1. A chassis comprising:
a plurality of slots including a first slot, wherein each of the plurality of slots is configured to receive a module comprising an information handling resource;
a plurality of modules, including a first module received in the first slot;
a power supply configured to deliver electrical energy to each of the plurality of modules; and
a controller communicatively coupled to the power supply and configured to perform operations comprising:
receiving a cumulative power signal, wherein the cumulative power signal is indicative of whether cumulative power consumption, comprising total power consumed by the plurality of modules, exceeds a cumulative power threshold;
responsive to detecting the cumulative power signal indicating cumulative power consumption exceeding the cumulative power threshold, decreasing a module power limit of the first module, wherein decreasing the module power limit of the first module comprises:
decreasing the module power limit of the first module at a first rate of decrease during an initial interval; and
decreasing the module power limit of the first module at a second rate of decrease during a subsequent interval following the initial interval, wherein the second rate of decrease differs from the first rate of decrease.

2. The chassis of claim 1, wherein the second rate of decrease exceeds the first rate of decrease.

3. The chassis of claim 1, wherein the initial interval begins when the cumulative power signal begins to indicate cumulative power consumption exceeding the cumulative power threshold and wherein the initial interval has a specific duration.

4. The chassis of claim 1, wherein the operations include:
responsive to detecting the cumulative power signal indicating cumulative power consumption below the cumulative power threshold, increasing the module power limit of the first module.

5. The chassis of claim 1, wherein decreasing the module power limit of the first module at a first rate of decrease during an initial interval comprises:
instantaneously decreasing the module power limit to a particular limit wherein the particular limit corresponds to a power consumption of a particular module, wherein the particular module consumes more power than any other module.

6. The chassis of claim 1, wherein the operations include:
receiving module power consumption information, wherein the module power consumption information is indicative of power consumed by each of the plurality of modules;
identifying, from the module power consumption information, a maximum module power consumed; and
establishing the maximum module power consumed as the module power limit.

7. A method for managing power in a chassis, wherein the chassis includes a plurality of slots, including a first slot, and a plurality of modules, including a first module, and a power supply, wherein each of the plurality of slots is configured to receive one of the plurality of modules and wherein the power supply is configured to deliver electrical energy to each of the plurality of modules, wherein the method includes:
receiving a cumulative power signal, wherein the cumulative power signal is indicative of whether cumulative power consumption, comprising total power consumed by the plurality of modules, exceeds a cumulative power threshold;
responsive to detecting the cumulative power signal indicating cumulative power consumption exceeding the cumulative power threshold, decreasing a module power limit of the first module, wherein decreasing the module power limit of the first module comprises:
decreasing the module power limit of the first module at a first rate of decrease during an initial interval; and
decreasing the module power limit of the first module at a second rate of decrease during a subsequent interval following the initial interval, wherein the second rate of decrease differs from the first rate of decrease.

8. The method of claim 7, wherein the second rate of decrease exceeds the first rate of decrease.

9. The method of claim 8, wherein the initial interval begins when the cumulative power signal begins to indicate cumulative power consumption exceeding the cumulative power threshold and wherein the initial interval has a specific duration.

10. The method of claim 7, further comprising:
responsive to detecting the cumulative power signal indicating cumulative power consumption below the cumulative power threshold, increasing the module power limit of the first module.

11. An article of manufacture comprising:
a non-transitory computer readable medium including processor-executable instructions that, when executed by a processor in a chassis, causes the processor to perform operations, wherein the chassis includes a plurality of slots, including a first slot, and a plurality of modules, including a first module, and a power supply, and wherein each of the plurality of slots is configured to receive one of the plurality of modules and wherein the power supply is configured to deliver electrical energy to each of the plurality of modules, and wherein the operations include:
receiving a cumulative power signal, wherein the cumulative power signal is indicative of whether cumulative power consumption, comprising total power consumed by the plurality of modules, exceeds a cumulative power threshold;
responsive to detecting the cumulative power signal indicating cumulative power consumption exceeding the cumulative power threshold, decreasing a module power limit of the first module, wherein decreasing the module power limit of the first module comprises:
decreasing the module power limit of the first module at a first rate of decrease during an initial interval; and
decreasing the module power limit of the first module at a second rate of decrease during a subsequent interval following the initial interval, wherein the second rate of decrease differs from the first rate of decrease.

12. The article of manufacture of claim 11, wherein the second rate of decrease exceeds the first rate of decrease.

13. The article of manufacture of claim 11, wherein the initial interval begins when the cumulative power signal begins to indicate cumulative power consumption exceeding the cumulative power threshold and wherein the initial interval has a specific duration.

14. The article of manufacture of claim 11, wherein the operations include:
responsive to detecting the cumulative power signal indicating cumulative power consumption below the cumulative power threshold, increasing the module power limit of the first module.

* * * * *